(12) United States Patent
Barnard et al.

(10) Patent No.: US 11,243,550 B2
(45) Date of Patent: Feb. 8, 2022

(54) OPTICAL-ELECTRICAL DEVICE USING HYBRID AUTOMATED TESTING EQUIPMENT

(71) Applicant: Juniper Networks, Inc., Sunnyvale, CA (US)

(72) Inventors: Chris Barnard, Sunnyvale, CA (US); Steven William Keck, Mountain View, CA (US); Crispin Cruz Mapagay, El Dorado Hills, CA (US); George R. Sosnowski, Sunnyvale, CA (US); Mark Stenholm, Fremont, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 99 days.

(21) Appl. No.: 16/887,668

(22) Filed: May 29, 2020

(65) Prior Publication Data

US 2021/0373585 A1    Dec. 2, 2021

(51) Int. Cl.
| | | |
|---|---|---|
| *G05D 23/32* | (2006.01) | |
| *G01K 7/16* | (2006.01) | |
| *G02B 6/42* | (2006.01) | |
| *G01J 1/44* | (2006.01) | |

(52) U.S. Cl.
CPC .............. *G05D 23/32* (2013.01); *G01J 1/44* (2013.01); *G01K 7/16* (2013.01); *G02B 6/4246* (2013.01); *G02B 6/4268* (2013.01); *G01J 2001/444* (2013.01)

(58) Field of Classification Search
CPC ...... G05D 23/32; G01J 1/44; G01J 2001/444; G01K 7/16; G02B 6/4246; G02B 6/4268
See application file for complete search history.

(56) References Cited

U.S. PATENT DOCUMENTS

| | | | |
|---|---|---|---|
| 5,334,829 A | 8/1994 | Ueno et al. | |
| 7,480,006 B1 | 1/2009 | Frank | |
| 2014/0294038 A1 | 10/2014 | Nakamura | |
| 2017/0122804 A1* | 5/2017 | Cao | G01J 1/0425 |
| 2017/0150081 A1 | 5/2017 | Stockmeier et al. | |
| 2020/0292769 A1* | 9/2020 | Zbinden | G02B 6/4269 |

FOREIGN PATENT DOCUMENTS

WO    WO-02056073 A1    7/2002

OTHER PUBLICATIONS

"European Application Serial No. 20181749.1, Extended European Search Report dated Dec. 14, 2020", 12 pgs.

* cited by examiner

*Primary Examiner* — Que Tan Le
*Assistant Examiner* — Don J Williams
(74) *Attorney, Agent, or Firm* — Schwegman Lundberg & Woessner, P.A.

(57) ABSTRACT

An optical-electrical device can implement a feedback-based control loop for temperature of the device during component calibration. The optical-electrical device can implement compressed air to vary the device temperature during calibration. Additionally, non-active components of the device can be provided current to vary the temperature of the device in concert with the provided compressed air. Additional calibration temperatures can be implemented by activating and deactivating additional non-active components in the device, such as light sources, optical amplifiers, and modulators.

20 Claims, 9 Drawing Sheets

OPTICAL-ELECTRICAL DEVICE USING HYBRID AUTOMATED TESTING EQUIPMENT

TECHNICAL FIELD

The present disclosure generally relates to temperature control, and more particularly to optical-electrical device temperature control mechanisms.

BACKGROUND

Modern high-speed integrated circuits (ICs) have complex architectures, with millions of components such as transistors that must operate in concert to transmit data at multi-gigabit data rates required by modern communication networks. One of the critical steps of manufacturing such devices is the testing and calibration of the high-speed devices to ensure the devices do not fail at a later point in time (after integration into a product). One issue with testing and calibration of such high-speed devices stems from the modern design process, in which different components of the device are designed by different companies as "off the shelf" components. To this end, automatic test equipment (ATE) can be implemented by the device engineers to efficiently test high-speed designs at the chip and wafer level. Generally, an ATE system includes one or more computer-controlled equipment or modules that interface with the device under test (DUT) to perform stress testing and analyze individual components with minimal human interaction. Current ATE systems that are configured for electronic or semiconductor devices are not configured to provide rapid testing and calibration of some modern hybrid high-speed devices, such as optical transceivers that process both electricity and light to achieve higher data rates.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the inventive subject matter. Thus, phrases such as "in one embodiment" or "in an alternate embodiment" appearing herein describe various embodiments and implementations of the inventive subject matter, and do not necessarily all refer to the same embodiment. However, they are also not necessarily mutually exclusive. To easily identify the discussion of any particular element or act, the most significant digit or digits in a reference number refer to the figure ("FIG.") number in which that element or act is first introduced.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

Modern ATE systems are not configured to rapidly test, validate, and calibrate modern hybrid high-speed devices, such as optical transceivers, which include both complex electrical and optical modules. To this end, a hybrid opto-electrical ATE system can be implemented that uses one or more electrical interfaces to interface with electrical apparatuses of the ATE system and one or more optical interfaces (e.g., fibers, lens, gratings) to interface with optical apparatuses of the ATE system. The different electrical and optical interfaces are typically physically large and it can be difficult to connect the various electrical and optical input/output ports to perform hybrid ATE testing. Further compounding this issue is the calibration of some optical components, which are calibrated at a certain temperature (e.g., in a small temperature range, e.g., a three-degree range) to ensure that each optical component functions correctly in the hybrid device under test (DUT). Furthermore, often components are calibrated at two different temperatures to ensure reliability across a spectrum of temperatures likely to be endured by the hybrid device (e.g., after manufacturing and integration into a product, such as an optical switch). One approach for controlling the temperature of the DUT during ATE calibration includes attaching a metal block (e.g., copper block) to the device, and then heating and cooling the block to the desired temperatures to perform device calibration. However, such blocks can be difficult to interface with the DUT in a crowded ATE environment, where the DUT is often no larger than a centimeter squared. Further, such blocks can easily cause damage to the DUT, which contains very fragile components (e.g., optical components that cannot be touched). Other approaches rely on integration of cooling structure (e.g., Peltier cooler) into the DUT; however, integrated cooling devices waste power and design space of the hybrid device, and an external cooling structure (e.g., external Peltier cooler) is difficult to interface with a DUT in an ATE environment such that attempting to place an external cooling structure creates potential for damage to the DUT.

To this end, a hybrid optical-electrical ATE system can implement a temperature control loop that uses airflow cooling and collateral device heat to change the DUT's temperature and efficiently maintain the DUT's temperature during one or more optical component calibration procedures. In some example embodiments, the hybrid optical-electrical ATE system implements compressed air from a directional channel (e.g., tube) that is mounted near a photonics integrated circuit (PIC) of the DUT. In some example embodiments, the DUT includes a temperature sensor that is used to monitor the temperature of the DUT and adjust the airflow to increase or decrease the DUT temperature. Further, in some example embodiments, while one or more components of the DUT (e.g., optical components on an optical path) are calibrated, other optical components not undergoing calibration are provided electrical current to generate heat to raise the temperature of the DUT.

As an example, assume the DUT is a wavelength-division multiplexing (WDM) optical transceiver with a PIC that includes an optical transmitter (e.g., lasers, modulators) and optical receiver (e.g., semiconductor amplifiers, photodiodes) that are to be calibrated at a given temperature: 40 degrees Celsius. In some example embodiments, the optical transmitter is first calibrated by activating the transmitter and turning on the compressed air source to blow air at a maximum level on the DUT. With the transmitter activated and the compressed air source at full power, each of the transmitter components can be calibrated while a closed control loop using the air flow maintains the DUT temperature, e.g., at 50 degrees Celsius. For example, if the DUT cools down to 35 degrees, the amount of compressed air source is reduced from the maximum to cause the DUT to heat again to 50 degrees.

Further, to quickly transition to a second temperature for calibration, one or more non-active components can be activated to heat the DUT to the second temperature. After the transmitter is calibrated at the first temperature, the optical receiver components of the DUT are activated to raise the temperature of the DUT to the second temperature. For instance, the optical SOAs in the optical receiver are powered on to receive current and generate heat.

In some example embodiments, in addition to the non-active components being activated, the airflow is again increased to maximum until the DUT settles to a second temperature point, or equilibrium. While at the second temperature, the transmitter components can be calibrated while the receiver components (e.g., SOAs) and compressed air maintain the DUT at the second temperature. In particular, for example, if the temperature of the DUT drops, the strength of the airflow is reduced to increase the DUT temperature until it is again at the second temperature. Alternatively, if the temperature of the DUT increases, one or more SOAs in the receiver are deactivated or their gain levels are reduced to reduce current provided and decrease the temperature of the DUT back to the second temperature.

Figure 1:
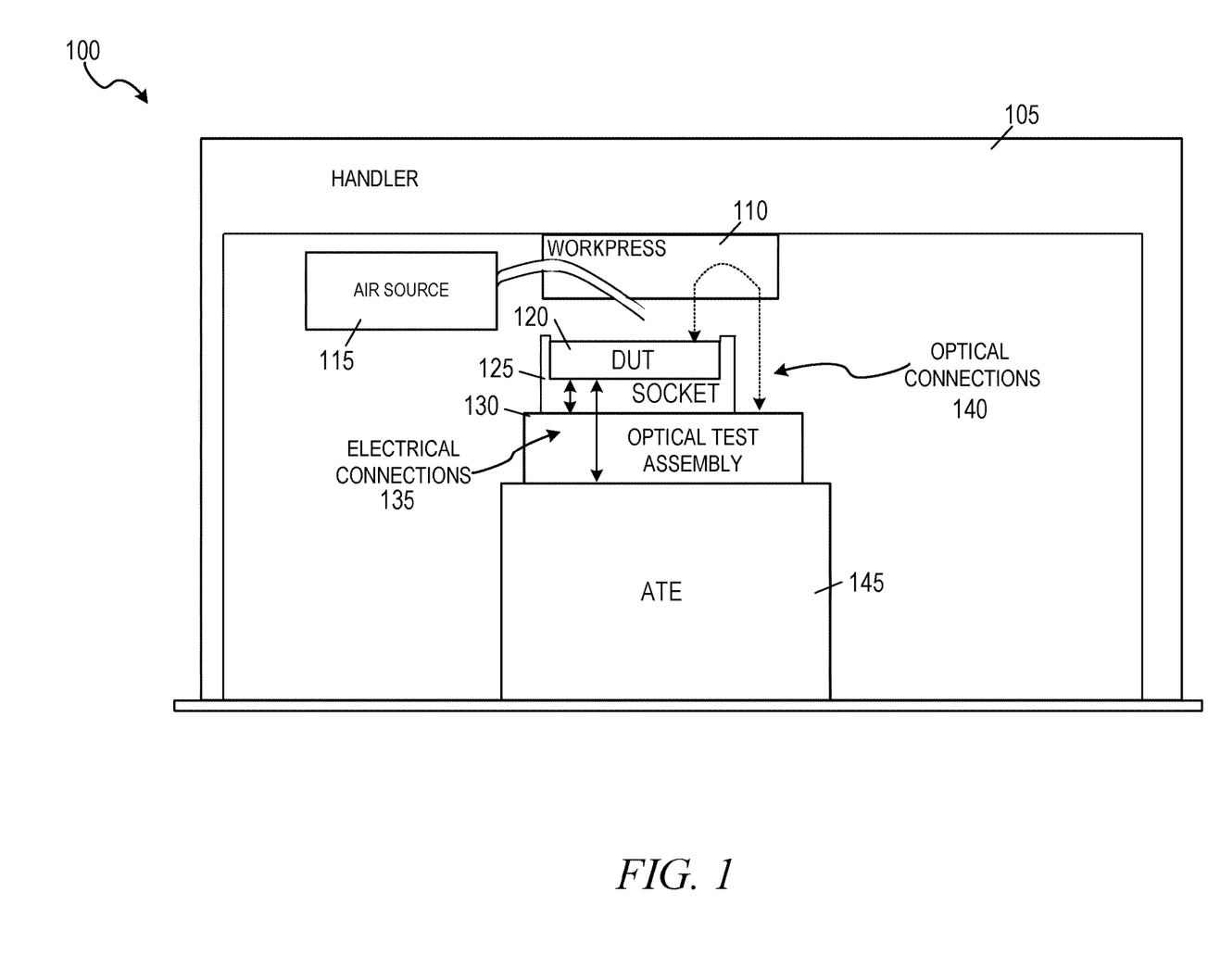
FIG. 1 shows an example opto-electrical test system for implementing simultaneous opto-electrical ATE test and calibration, according to some example embodiments.

FIG. 1 shows an optical and electrical testing system 100 for implementing simultaneous optical and electrical temperature-controlled testing of photonic devices, according to some example embodiments. As illustrated, a handler 105 (e.g., integrated circuit (IC) handler, chip hander) is a robotic system that can carefully move a device under test (DUT) 120 into position for testing and calibration. A workpress 110 (e.g., a workpress assembly) is attached to the handler 105 to move the DUT 120 to the test socket base 125. The test socket base 125 is further positioned on an optical test assembly 130, which provides optical testing of the DUT 120 using one or more optical analysis modules (e.g., an optical spectrum analyzer, OSA), and an electrical automated test equipment (ATE) 145, which provides electrical automated testing using one or more electrical analyzer modules. The DUT 120 is electrically connected via electrical connections (e.g., high speed socket 125) to the optical test assembly and the ATE 145. Furthermore, the DUT 120 can interface optically with the optical test assembly using one or more optical connections 140. For example, the optical connections 140 can be implemented as fibers that extend from the optical test assembly 130 into the workpress 110, and are turned back towards the topside of the DUT 120 (e.g., which can be a top side, or "bottom side" in a flip chip configuration where the "top side" faces towards an interposer or host board). Further functional components and details of the optical test assembly are discussed in further detail below, with reference to FIG. 3. Once aligned with the optical and electrical contacts of the optical and electrical testing system 100, the DUT 120 can undergo simultaneous electrical and optical testing and calibration. Further, to enable accurate calibration of the DUT 120 at certain temperatures and air source 115 applies an airflow on the DUT 120 via a directed air channel (e.g., hose, tube, hollow pathway) that extends through the workpress 110 to direct pressured air towards the DUT to remove heat, as discussed in further detail below with reference to FIG. 4.

Figure 2:
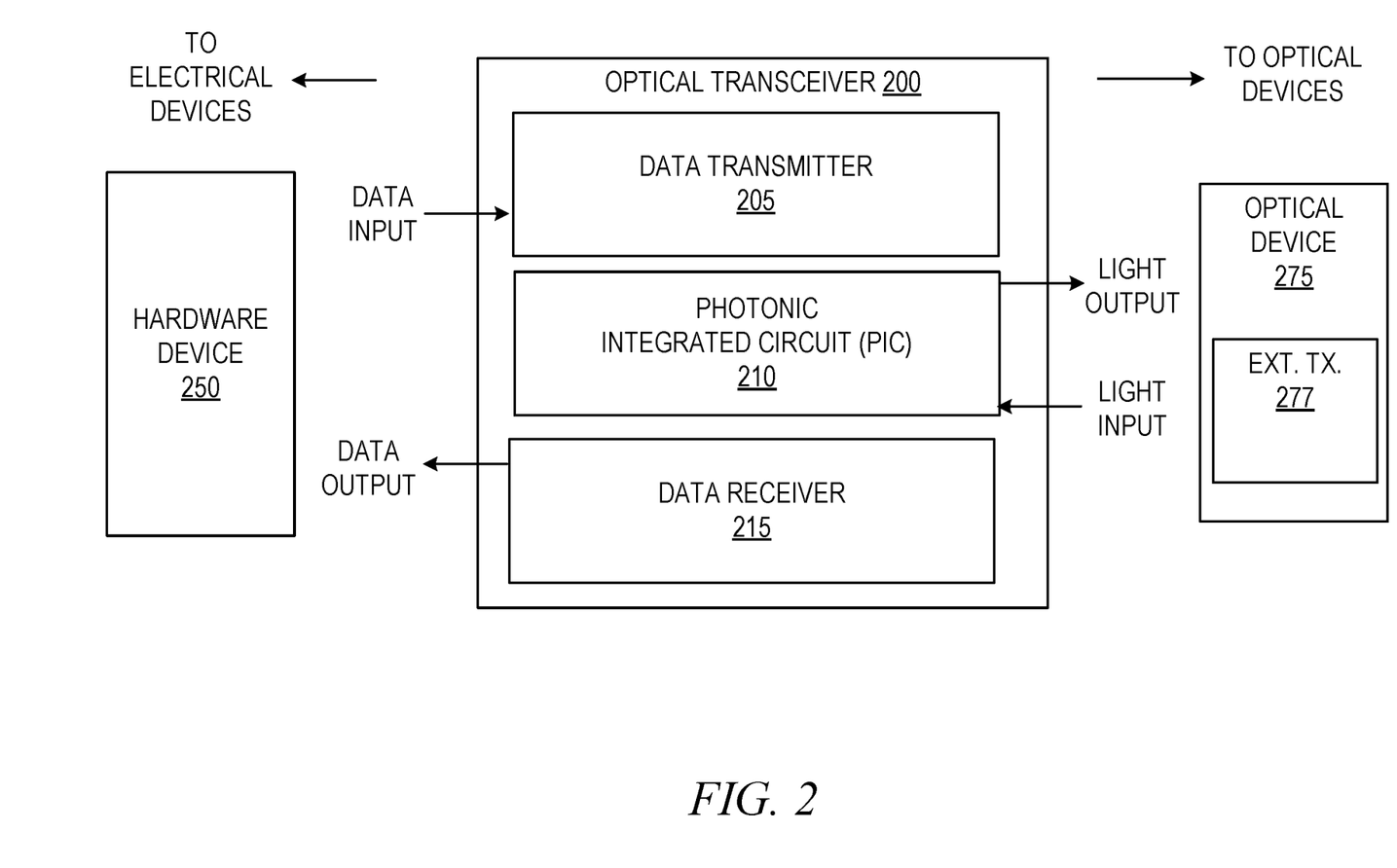
FIG. 2 is a block diagram illustrating an optical transceiver for transmitting and receiving optical signals, according to some example embodiments.

FIG. 2 is a block diagram illustrating an optical transceiver for transmitting and receiving optical signals, according to some example embodiments. The optical transceiver 200 is an example system in which a split gain amplifier can be integrated. As illustrated, the optical transceiver 200 can be implemented to interface electrical data from electrical devices, such as electrical hardware device 250, convert the electrical data into optical data, and send and receive the optical data with one or more optical devices, such as optical device 275. For explanatory purposes, in the following description the electrical hardware device 250 is a host board that "hosts" the optical transceiver 200 as a pluggable device that sends and receives data to an optical switch network; where, for example, optical device 275 can be other components of an optical switch network (e.g., external transmitter 277). However, it is appreciated that the optical transceiver 200 can be implemented to interface with other types of electrical devices and optical devices. For instance, the optical transceiver 200 can be implemented as a single chip on a hybrid "motherboard" that uses an optical network (e.g., waveguides, fibers) as an optical bus to interconnect on-board electrical chips that process the data after it is converted from light into binary electrical data, according to some example embodiments.

In some example embodiments, the hardware device 250 includes an electrical interface for receiving and mating with an electrical interface of the optical transceiver 200. The optical transceiver 200 may be a removable front-end module that may be physically received by and removed from hardware device 250 operating as a backend module within a communication system or device. The optical transceiver 200 and the hardware device 250, for example, can be components of an optical communication device or system (e.g., a network device) such as a wavelength-division multiplexing (WDM) system, including a dense wavelength division multiplexing (DWDM) system. For instance, a WDM system may include a plurality of slots reserved for a plurality of hardware device host boards.

The data transmitter 205 of the optical transceiver 200 can receive the electrical signals, which are then converted into optical signals via PIC 210. The PIC 210 can then output the optical signals via optical links, such as fiber or waveguides that interface with the PIC 210. The output light data can then be processed by other components (e.g., switches, endpoint servers, other embedded chips of on a single embedded system), via a network such as a wide area network (WAN), optical switch network, optical waveguide network in an embedded system, and others.

In receiver mode, the optical transceiver 200 can receive high data rate optical signals via one or more optical links to optical device 275. The optical signals are converted by the PIC 210 from light into electrical signals for further processing by data receiver 215, such as demodulating the data into a lower data rate for output to other devices, such as the electrical hardware device 250. The modulation used by the optical transceiver 200 can include pulse amplitude modulation (e.g., PAM4), quadrature phase-shift keying (QPSK), binary phase-shift keying (BPSK), polarization-multiplexed BPSK, M-ary quadrature amplitude modulation (M-QAM), and others.

Figure 3:
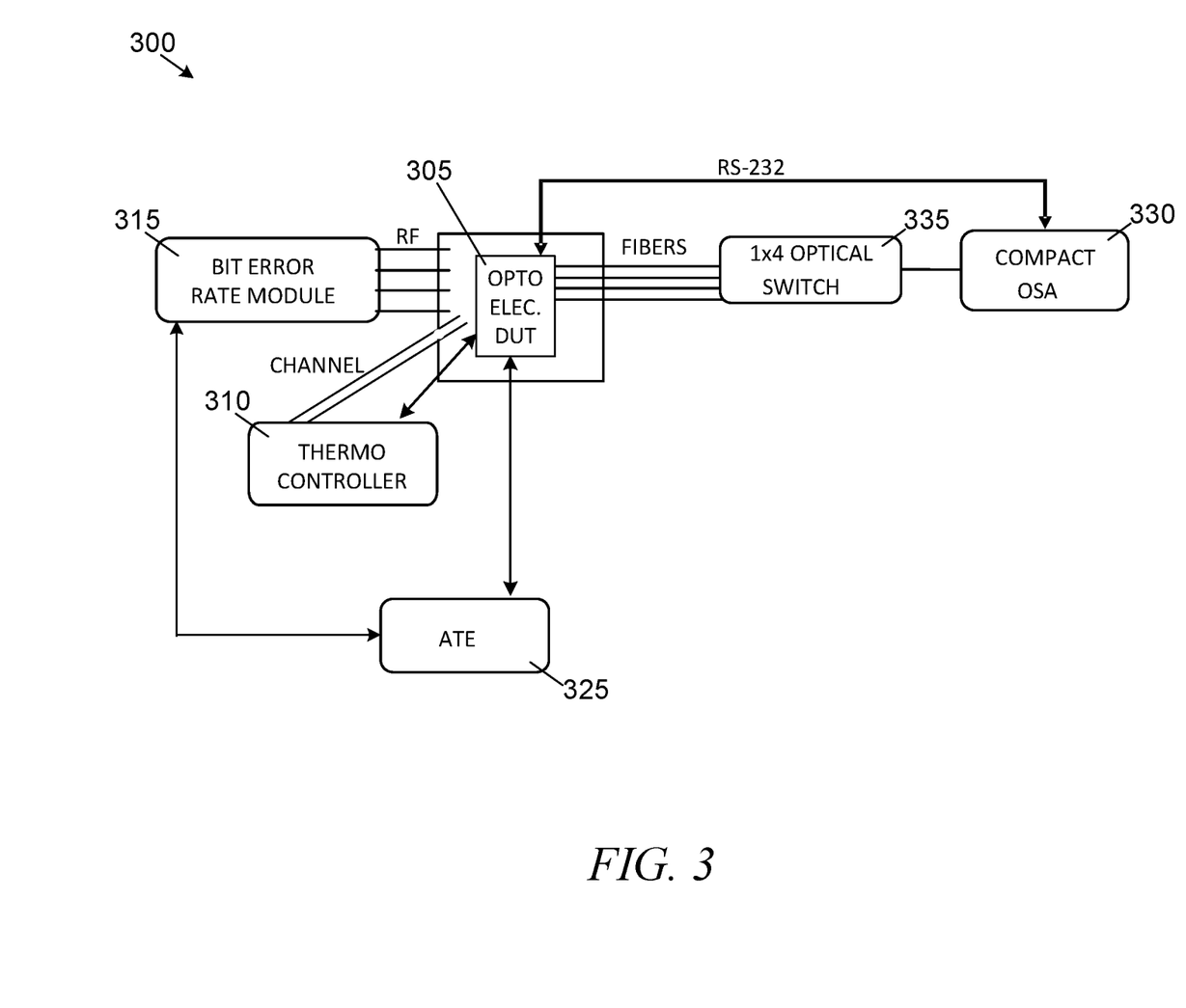
FIG. 3 displays an optical-electrical ATE architecture, according to some example embodiments.

FIG. 3 displays an optical-electrical ATE architecture 300, according to some example embodiments. The optical-electrical ATE architecture 300 is an example implementation of the optical test assembly 130 for optical testing and calibration of optical devices. At a high level, the ATE 325 interfaces with the optical electrical device under test 305 and a bit error rate module 315 (e.g., an embedded BER tester). Further, and in accordance with some example embodiments, the ATE 325 can interface and display data from a compact OSA 330 that interfaces electrically with the DUT 305 using an RS-232 interface, and optically via one or more fibers and an optical switch 335. In some example embodiments, the DUT 305 generates different light beams (e.g., at different wavelengths, or on different channels) that output onto one or more of a plurality of fibers 331 (e.g., optical connections 140, FIG. 1). In those example embodiments, the optical switch 335 is operable to select one of the available plurality of fibers for output to the comp act OSA 330. Further illustrated in the architecture 300 is a thermocontroller 310 (e.g., temperature sensor 408, air tube 425, airflow valve 403) which can direct compressed air towards the DUT 305 via a directional channel such that the DUT 305 remains at one or more calibration temperatures, as discussed below with reference to FIGS. 7-8.

Figure 4:
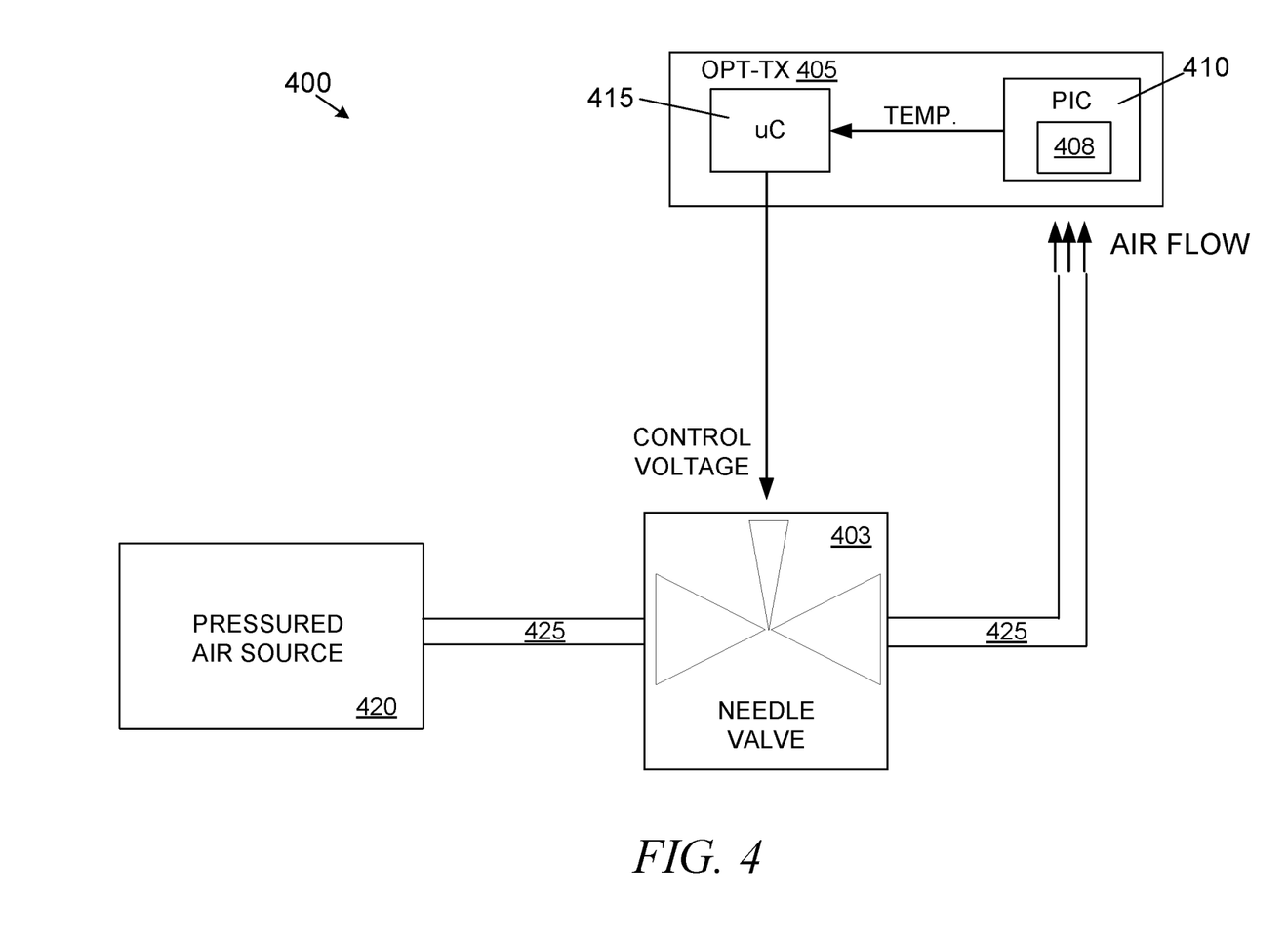
FIG. 4 shows opto-electric ATE temperature control architecture for airflow-based control of an optical-electrical device under test (DUT), according to some example embodiments.

FIG. 4 shows opto-electric ATE temperature control architecture 400 for airflow-based control of an optical-electrical device under test (DUT) 405, according to some example embodiments. In the example illustrated, the optical-electrical DUT comprises a PIC 410 and a processor 415 (e.g., central processing unit (CPU), microcontroller, application specific integrated circuit (ASIC)). In some example embodiments, the PIC 410 includes one or more embedded temperature sensors 408 that sense the temperature of the PIC 410.

In some example embodiments, to operate in a closed control loop (e.g., feedback calibration loop), the optical-electrical DUT 405 initializes to a first temperature, and the temperature sensor 408 in the PIC 410 measures the temperature of the PIC 410 and sends the temperature as temperature data to the processor 415. The processor converts the digital data into a control signal voltage (e.g., using a digital to analog converter, DAC) which controls an airflow valve 403. For example, airflow valve 403 can include a voltage controlled needle valve having a linear actuator that actuates to close or open an air channel, such as the air tube 425.

In the example illustrated, the air flow is generated by a pressured air source 420 (e.g., an air compressor, a high speed fan) which forces air into the tube 425 at high pressure (e.g., pressure higher than ambient or surrounding environment air pressure). The tube 425 is beneficial over other approaches, such as using a fan, because the tube 425 can have a small diameter that can be more readily be positioned near a specific small area to be cooled, such as a PIC 410, to direct a strong current of heat wicking air over the area without touching the surface. One additional benefit of compressed air cooling via tube 425 is that it is contactless and does not require physically interfacing with the PIC 410, which has numerous delicate components that can be ruined by physical contact (e.g., physically mounting a heat sink to the PIC 410 or device 405).

Figure 5:
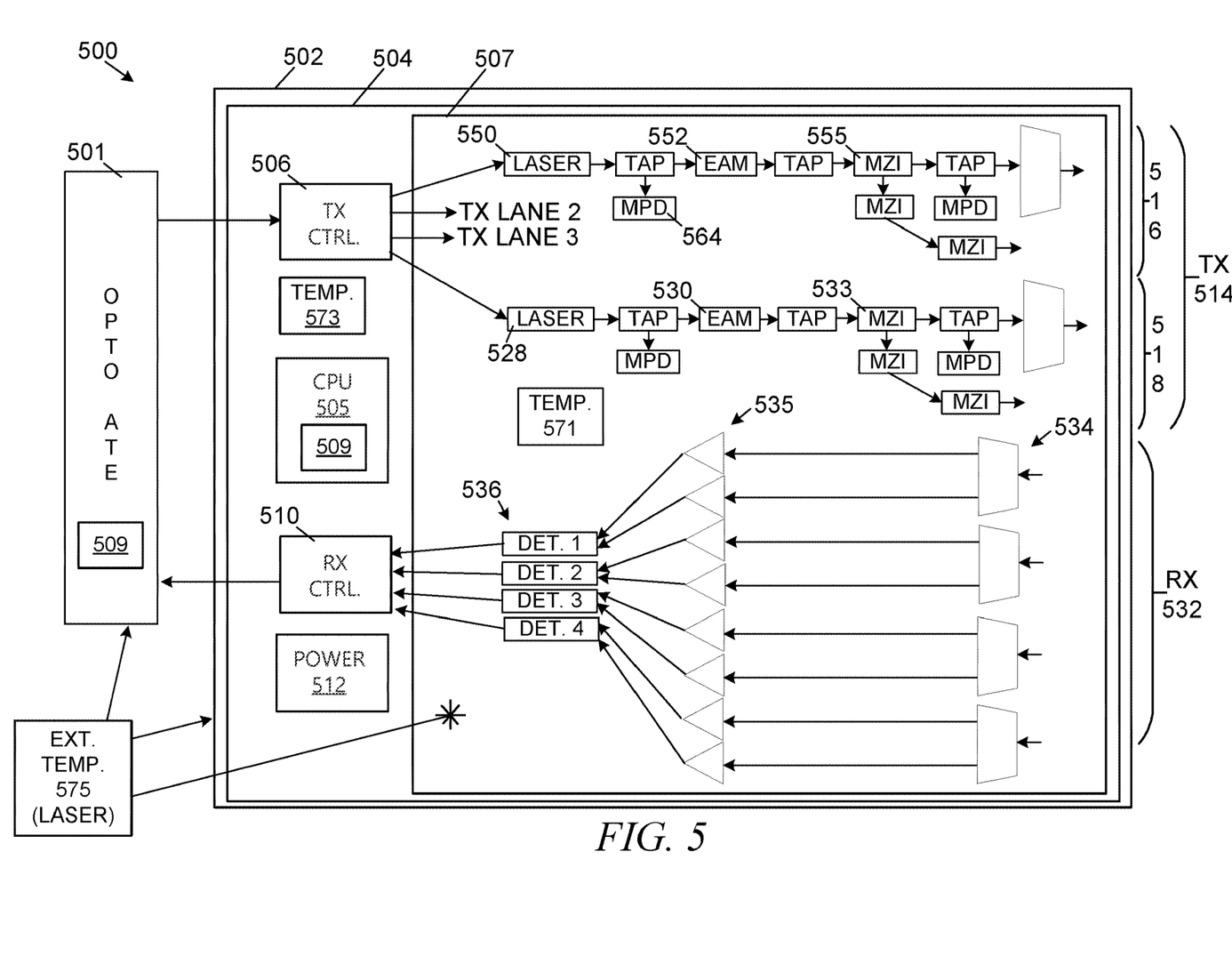
FIG. 5 shows a photonics temperature control architecture, according to some example embodiments.

FIG. 5 shows a photonics temperature control architecture 500, according to some example embodiments. As illustrated, the architecture 500 displays an optical-electrical DUT 502 which is a device under test that interfaces with the optical-electrical automated testing equipment (ATE) system 501, as described above with reference to FIG. 1 and FIG. 3. The optical-electrical DUT 502 comprises an electronics module 504 and a photonics module 507.

The electronics module 504 includes electrical components (e.g., electrical conduction pathways/traces, circuit control logic, ASICs, processors, power control circuits, etc.), which can be integrated as one or more electrical structures in a packaged chip, such as ASIC 615 of FIG. 6, described in further detail below. In the example illustrated, the electronics module 504 includes a transmitter controller 506 (e.g., data transmitter 205, FIG. 2) that receives signal for optical modulation (e.g., PAM4 data, QPSK data). In some example embodiments, a hardware processor 505 (e.g., a CPU, ASIC, microprocessor) controls different processes of the optical-electrical DUT 502. For example, the hardware processor 505 can include an optical thermal feedback engine 509, which is stored as instructions on memory of a hardware processor 505 (e.g., firmware), or optical-electrical ATE system 501 (e.g., stored in memory as an application and executed by one or more processors of optical-electrical ATE system 501). The instructions can then be executed by the processor 505 to execute closed-loop control of the photonics module 507 for calibration testing. Additionally, and in accordance with some example embodiments, the processor 505 can be implemented as an integrated ASIC that is specifically designed to implement optical closed-loop control operations as discussed in further detail below with reference to FIGS. 7-9.

The electronics module 504 further includes a receiver controller 506 (e.g., data receiver 215, FIG. 2), which can receive optical data generated by the optical receiver components in the photonics module 507. Electronics module 504 can further include a power control circuit 512 to supply and control electrical power for the optical-electrical DUT 502, including electronic components in the electronics module 504, and further supply electrical power to be photonics module 507 to power various electrically controlled photonic components (e.g., lasers, silicon optical amplifiers, filters, modulators, and so forth).

In some example embodiments, the photonics module 507 is a wavelength division multiplexing (WDM) transceiver architecture comprising an integrated photonics transmitter structure 514 and an integrated photonics receiver structure 532. In some example embodiments, the integrated photonics transmitter structure 514 and the integrated photonics receiver structure 532 are example optical components fabricated as a PIC device, such as PIC 620 of FIG. 6, discussed in further detail below. The integrated photonics transmitter structure 514 is an example of a WDM transmitter having four lanes, in which each lane handles a different wavelength of light. For brevity, in the example illustrated only two lanes of the transmitter are illustrated, including the first transmitter lane 516 and the fourth transmitter lane 518; the second and third transmitter lanes are omitted.

The integrated photonics receiver structure 532 is an example of a WDM receiver that receives WDM light (e.g., from an optical network) and processes the light by filtering, amplifying, and converting it to electrical signal using components such as multiplexers 534, semiconductor optical amplifiers 535 (SOAs) and one or more detectors such as photodetectors 536 (e.g., photodiodes).

According to some example embodiments, one or more of the photonics components of the photonics module 507 are activated to act as heaters to control the temperature of the optical-electrical DUT as part of a closed feedback control loop to maintain the DUT temperature without use of external heaters (e.g., metal heat source, such as copper block to add heat, or heatsink to wick away heat). In some example embodiments, a temperature sensor 571 (e.g., a resistance-based temperature sensor, a temperature diode module) is integrated (e.g., fabricated) in the photonics layer 507 to generate temperature data or signal for control processing of the device 502. In some example embodiments, the device 502 does not include a temperature sensor, and a contactless external temperature probe (e.g., temperature laser probe) is used in the closed-control loop to control the temperature of the device 502 during calibration (e.g., via interface to the ATE system 501 or via input of data into registers of the CPU 505). In other example embodiments, the temperature sensor is integrated external to the photonics module 507, such as temperature sensor 573 that is integrated in electronics module but is still near enough to the active photonic component's to be calibrated to indicate the temperature of the active photonic components undergoing calibration.

In some example embodiments, the heat generated for calibration is collateral or byproduct heat that is repurposed in that it is generated by modules for purposes other than heating DUT components that are undergoing calibration (e.g., wafer-level testing during manufacturing or fabrication). For example, one or more components of the photonics module 507 may be powered on to process light using DC current, which passively generates heat that radiates to nearby areas of the photonics module 507. Additionally, DC current may not only be used to power on or activate such components, but also to set certain operating characteristics of the components, such as setting gain (e.g., of an SOA), bias (e.g., of filters, diodes), and so on. For instance, the laser 550, laser 528, the electro-absorption modulator (EAM) 552, the monitor photodiode 564, MZI filter 533, and the MZI filter 555 are some components that receive DC current to power on or set operational parameters.

Additional sources of repurposed heat can come from integrated heaters that are dedicated to various optical components to control the optical operating characteristics of the component. In particular, for example, the EAM 530 is a modulator that can impart modulation on an optical signal using a heater. While the heater of the EAM 530 is designed to produce heat, it is designed to produce heat to control the EAM 530 specifically, and is not designed to be a heater for non-EAM 530 purposes (e.g., to heat the entire photonics module 507). As an additional example, the laser 528 may have several heaters dedicated to controlling heating of the laser 528 such that it generates the correct laser light for that path (e.g., path 518). While the dedicated heaters are required to heat in specific ways for their various corresponding components, in some example embodiments the heaters are held at maximum power to produce heat that is repurposed along with the DC current (e.g., used to activate and bias components) to heat the other components undergoing calibration in a rapid and non-destructive manner.

In accordance with some example embodiments, when the components in one of the optical paths of the optical-electrical DUT is being tested (e.g., analyzed and calibrated), the heat-generating components of other non-active optical paths are activated to provide heat to the path under test. For example, if the components of the first transmitter lane 516 are undergoing calibration (e.g., tuning the laser 550, tuning the various bias of filters such as MZI filter 555, setting RF bias etc.), and require a stable calibration temperature at a given temperature, then heat-generating components of other lanes (e.g., the fourth transmitter lane 518) can be activated or deactivated to raise and lower the temperature of the path under test so that it remains stable at the calibration temperature.

Further, in some example embodiments, while some or all of the components in the integrated photonics transmitter structure 514 are undergoing calibration, the components of the integrated photonics receiver structure 532 may be repurposed to provide heat and hold the integrated photonics transmitter structure 514 at a stable temperature. For example, if all four lanes of the integrated photonics transmitter structure 514 are being calibrated (e.g., each of the lane handles one channel of 4-channel WDM light), then the heat-generating components (e.g., heaters and current-supplied points) within the integrated photonics transmitter structure 514 are being utilized/tested and cannot be repurposed as heaters. To this end, one or more components of the integrated photonics receiver structure 532 are implemented to act as passive calibration heaters for calibration of the integrated photonics transmitter structure 514. For example, while the components in the integrated photonics transmitter structure 514 are undergoing testing and calibration using the ATE system 501, all of the DC current input points in the integrated photonics receiver structure 532 may receive current at their respective highest levels of DC current. For example, the gain of each of the semiconductor optical amplifier 535 may be increased to maximum gain, and the DC bias gain of each of the photodetectors (photodiodes) 536 may be increased to their respective maximum operational levels.

Figure 6:
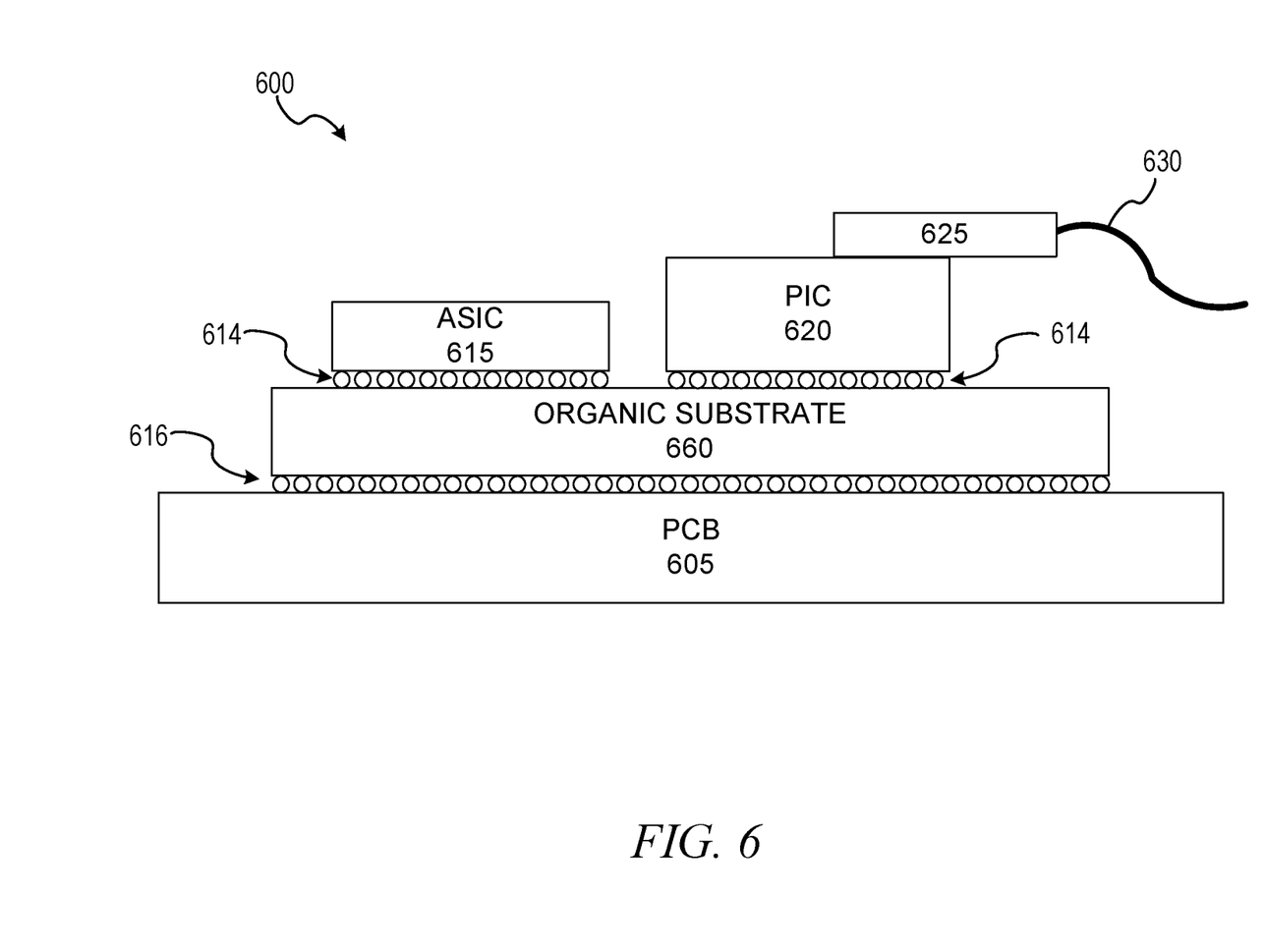
FIG. 6 is an illustration of an opto-electrical device (e.g., optical transceiver) including one or more optical devices according to an embodiment of the disclosure.

FIG. 6 is an illustration of an opto-electrical device 600 (e.g., optical transceiver) including one or more optical devices according to an embodiment of the disclosure. In this embodiment, the opto-electrical device 600 is shown to include printed circuit board (PCB) substrate 605, organic substrate 660, ASIC 615, and photonic integrated circuit (PIC) 620. In this embodiment, the PIC 620 may include one or more optical structures described above (e.g., PIC 210, FIG. 2; photonics module 507, FIG. 5).

In some example embodiments, the PIC 620 includes silicon on insulator (SOI) or silicon-based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material. III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V-based materials may be significantly higher than in silicon-based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light. Thus, III-V semiconductor materials enable photonic operation with an increased efficiency at generating light from electricity and converting light back into electricity.

The low optical loss and high quality oxides of silicon are thus combined with the electro-optic efficiency of III-V semiconductors in the heterogeneous optical devices described below; in embodiments of the disclosure, said heterogeneous devices utilize low loss heterogeneous optical waveguide transitions between the devices' heterogeneous and silicon-only waveguides.

Magneto-optic materials allow heterogeneous PICS to operate based on the magneto-optic (MO) effect. Such devices may utilize the Faraday Effect, in which the magnetic field associated with an electrical signal modulates an optical beam, offering high bandwidth modulation, and rotates the electric field of the optical mode enabling optical isolators. Said magneto-optic materials may comprise, for example, materials such as iron, cobalt, or yttrium iron garnet (YIG). Further, in some example embodiments, crystal substrate materials provide heterogeneous PICs with a high electro-mechanical coupling, linear electro optic coefficient, low transmission loss, and stable physical and chemical properties. Said crystal substrate materials may comprise, for example, lithium niobate (LiNbO3) or lithium tantalate (LiTaO3).

In the example illustrated, the PIC 620 exchanges light with fiber 630 via prism 625; said prism 625 is a misalignment-tolerant device used to couple an optical mode to a single-mode optical fiber, according to some example embodiments. In other example embodiments, multiple fibers are implemented to receive light from the prism 625 for various optical modulation formats (e.g., parallel single mode, with four lanes (PSM4)).

In some example embodiments, the optical devices of PIC 620 are controlled, at least in part, by control circuitry included in ASIC 615. Both ASIC 615 and PIC 620 are shown to be disposed on copper pillars 614, which are used for communicatively coupling the ICs via organic substrate 660. PCB 605 is coupled to organic substrate 660 via ball grid array (BGA) interconnect 616, and may be used to interconnect the organic substrate 660 (and thus, ASIC 615 and PIC 620) to other components of system 600 not shown—e.g., interconnection modules, power supplies, etc.

Figure 7:
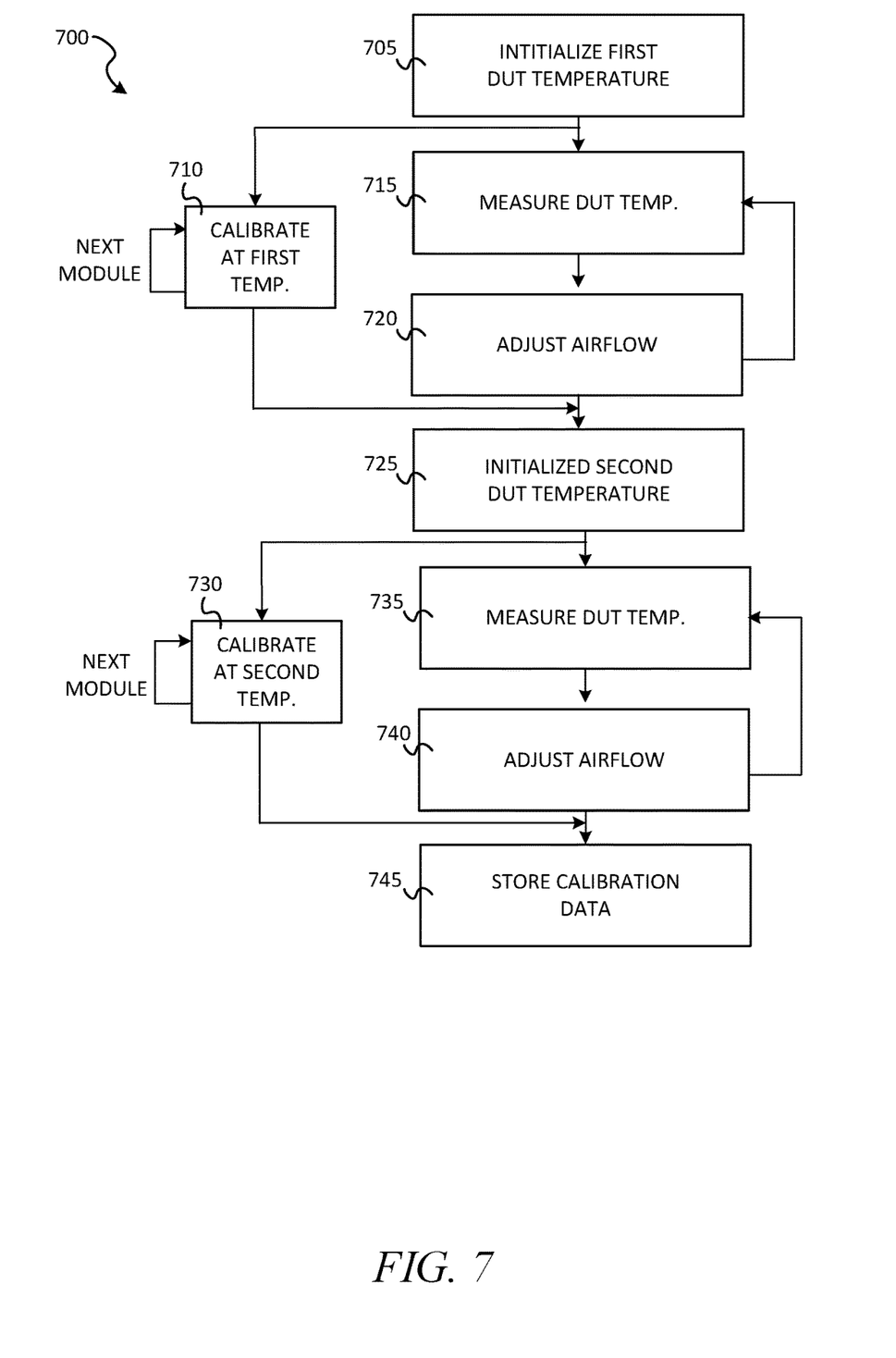
FIG. 7 shows a flow diagram of a method for implementing optical-electrical device calibration at one or more calibration temperatures using an optical-electrical ATE system and closed loop control of a higher pressure airflow, according to some example embodiments.

FIG. 7 shows a flow diagram of a method 700 for implementing optical-electrical device calibration at one or more calibration temperatures using an optical-electrical ATE system and closed-loop control of a higher pressure airflow, according to some example embodiments. In the example of FIG. 7, the different components integrated in an optical-electrical device (e.g., lasers, photodetectors, amplifiers) are calibrated at two temperatures, a minimum temperature and a maximum temperature. The minimum and maximum temperatures can be, for example, the minimum and maximum operating temperatures that the optical-electrical device will endure in operation (e.g., 30 degrees Celsius to 70 degrees Celsius). It is appreciated that in some example embodiments, one or more of the components need only be calibrated at a single given temperature. In those example embodiments, various operations of the method 700 of FIG. 7 (e.g., operations 725-740) can be omitted and calibration is performed only for the first calibration temperature (e.g., 40 degrees Celsius).

At operation 705, the optical thermal feedback engine 509 initializes the first device under test temperature (e.g., 30° C., or 5° above room temperature). In some example embodiments, to set the device under test at the first temperature, the optical components that are on path to be calibrated (e.g., path 516) are powered on or otherwise active, which causes the devices to generate heat. In some example embodiments, after the components to be calibrated are powered on, the temperature of the device stabilizes (e.g., stabilizes to degrees Celsius). After the device has stabilized at the temperature, the directed airflow is applied to decrease the heat to the first temperature (30° C.). In this way, the temperature of the device can not only be decreased by increasing the airflow, but further the temperature of the device can be increased by decreasing the airflow (which allows the device to stabile at its stabilized temperature after being powered on but before air is applied, e.g., 40 degrees Celsius).

After the device under test is set to the first temperature using airflow at operation 705, one or more components of the device under test are then calibrated at operation 710. For example, at operation 710, the laser 550 in the first transmitter lane 516 is calibrated while at the first temperature set at operation 705. In some example embodiments, one or more additional components of the optical electrical device under test are also then calibrated at the same temperature by looping back to operation 710. For instance, the engine 509 may first calibrate the laser 550 at the first temperature, then calibrate the EAM 552 at the first temperature, followed by calibrating the MZI 555 at the first temperature until all parts to be calibrated at the first temperature are calibrated, thereby ending the calibration loop at operation 710.

While calibration of the one or more components is performed at operation 710, the optical thermal feedback engine 509 simultaneously implements operations 715 and 720 to perform closed-loop (feedback-based) control of the optical-electrical DUT at the first temperature. For example, at operation 715, a temperature sensor (e.g., PIC temperature sensor 408, FIG. 4) generates temperature data or a signal (e.g., analog signal), which is then transmitted to the processor (e.g., processor 415 in FIG. 4). At operation 720, the engine adjusts the airflow based on the temperature feedback provided by the PIC temperature sensor. For example, in response to the optical-electrical DUT increasing in temperature, the engine 509 generates a control signal voltage (e.g., via a digital-to-analog converter, DAC) connected to a linear actuator that actuates to direct a stronger airflow towards the PIC to cool the PIC back to the first temperature.

At operation 725, the optical thermal feedback engine 509 initializes the second device under temperature. For example, one or more photonics components of the optical-electrical device that are not undergoing calibration are activated to increase an amount of heat and raise the temperature of the device to the second temperature.

After the optical-electrical device is set to the second temperature at operation 725, one or more components of the device under test are calibrated at the second temperature. For example, each of the same components calibrated at operation 710 at the first temperature are again calibrated at operation 730, but at the second temperature, where operation 730 loops to calibrate each additional optical component.

While calibration of the one or more components is performed at operation 730, the optical thermal feedback engine 509 simultaneously implements operations 735 and 740 to perform closed-loop (feedback-based) control of the optical-electrical DUT at the second temperature. For example, at operation 735, a temperature sensor (e.g., PIC temperature sensor 408, FIG. 4) generates temperature data or a signal (e.g., analog signal), which is then transmitted to the processor (e.g., processor 415 in FIG. 4). At operation 740, the engine 509 adjusts the airflow based on the temperature feedback provided by the PIC temperature sensor. For example, in response to the temperature of the optical-electrical DUT increasing in temperature, the engine 509 generates a control signal voltage (e.g., via a digital-to-analog converter, DAC) connected to a linear actuator that actuates to allow more air to flow, which is then directed via a tube towards the PIC to return to the second temperature.

At operation 745, the engine 509 stores calibration data to the device to complete the calibration process. For example, at operation 745, the engine 509 stores the gain, modulator, bias values that can be used to operate the device at a later point in time (e.g., after manufacturing time, in the field, integrated into another product).

Figure 8:
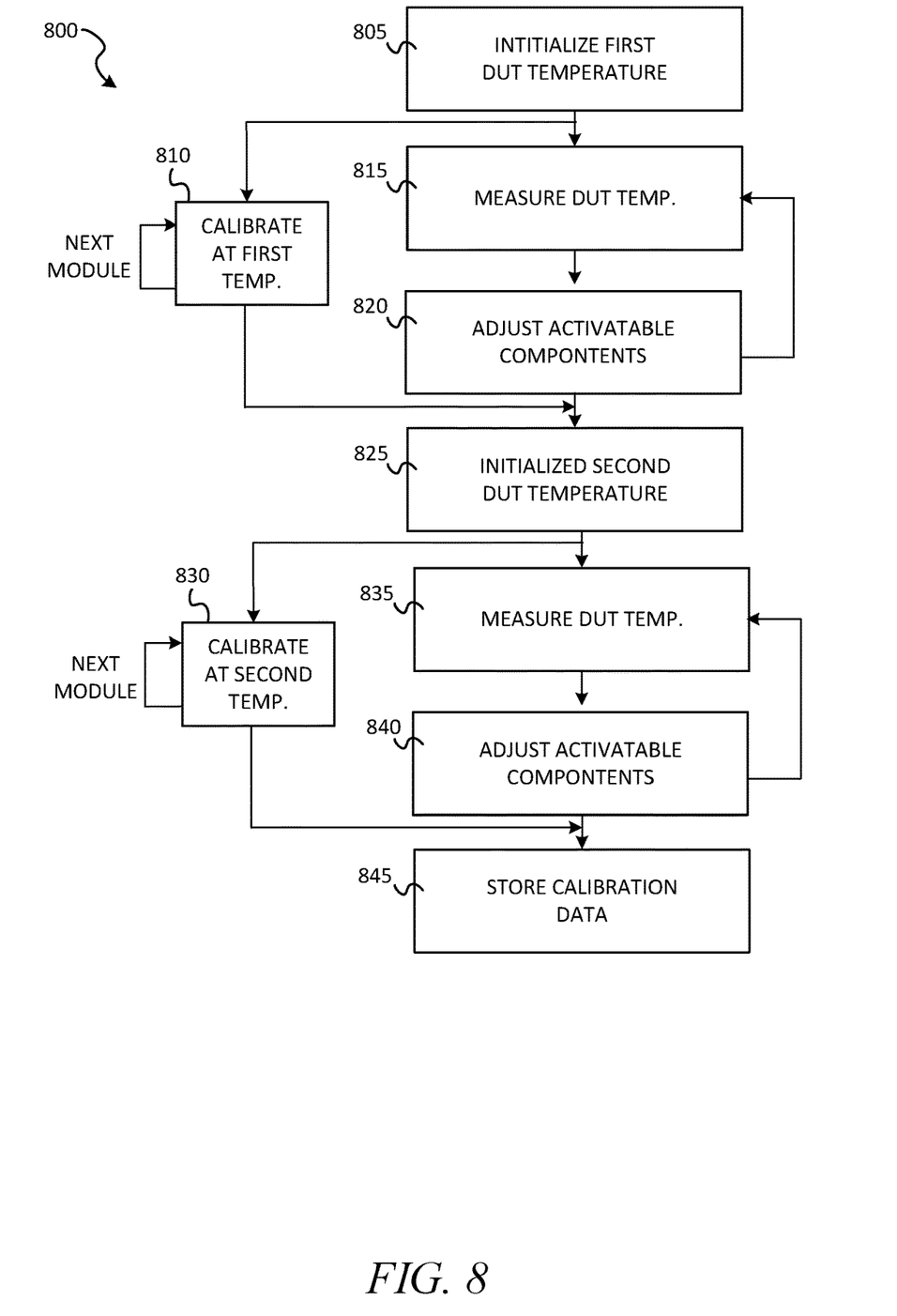
FIG. 8 shows a flow diagram of a method for implementing optical-electrical device calibration at one or more calibration temperatures using an optical-electrical ATE system and closed loop control of byproduct heat generating components in the optical-electrical device, according to some example embodiments.

FIG. 8 shows a flow diagram of a method 800 for implementing optical-electrical device calibration at one or more calibration temperatures using an optical-electrical ATE system and closed-loop control of byproduct heat-generating components in the optical-electrical device, according to some example embodiments. In the example of FIG. 8, the different components integrated in an optical-electrical device (e.g., lasers, photodetectors, amplifiers) are calibrated at two temperatures, a minimum temperature and a maximum temperature. The minimum and maximum temperatures can be, for example, the minimum and maximum operating temperatures that the optical-electrical device will endure in operation (e.g., 30 degrees Celsius to 120 degrees Celsius). It is appreciated that in some example embodiments, one or more of the components need only be calibrated at a single given temperature. In those example embodiments, various operations of the method 800 of FIG. 8 (e.g., operations 825-840) can be omitted and calibration is performed only for the first calibration temperature (e.g., 40 degrees Celsius).

At operation 805, the optical thermal feedback engine 509 initializes the first device under test temperature (e.g., 120 degrees Celsius). In some example embodiments, to set the device under test at the first temperature, one or more optical components on PIC of the device are activated to raise the temperature of the PIC to the first temperature. For example, if in method 800 only one of a multi-lane transceiver is being calibrated, then the components in the other lanes that are not being calibrated are powered on (e.g., receiver DC current, power on one or more component heaters) to raise the temperature of the device to the first temperature; or additionally, the current-driven components in the optical receiver portion of the device (e.g., SOAs 535) are all activated and set at maximum gain to increase the temperature of the device to the first temperature.

After the optical-electrical device under test is set to the first temperature at operation 805, one or more components of the device under test are then calibrated at operation 810. For example, at operation 810, the laser 550 in the first transmitter lane 516 is calibrated while at the first temperature set at operation 805. In some example embodiments, one or more additional components of the optical electrical device under test are also then calibrated at the same temperature by looping back to operation 810. For instance, the engine 509 may first calibrate the laser 550 at the first temperature, then calibrate the EAM 552 at the first temperature, followed by calibrating the MZI 555 at the first temperature until all parts to be calibrated at the first temperature are calibrated, thereby ending the calibration loop at operation 810.

While calibration of the one or more components is performed at operation 810, the optical thermal feedback engine 509 simultaneously implements operations 815 and 820 to perform closed-loop (feedback-based) control of the optical-electrical DUT at the first temperature using non-airflow based mechanism, such as activating and deactivating other non-calibrated optical or electrical components in the device. For example, at operation 815, a temperature sensor (e.g., PIC temperature sensor 408, FIG. 4) generates temperature data or a signal (e.g., analog signal), which is then transmitted to the processor (e.g., processor 415 in FIG. 4). At operation 820, in response to the temperature increasing, the engine 509 deactivates one or more of the activated components used to set the device at the first temperature. For instance, the SOAs 535 are deactivated, thereby decreasing heat from the SOAs 535 and reducing the temperature of the device back to the first temperature. Conversely, if the device temperature drops, then at operation 820 the engine 509 enables more components on the device that are not undergoing calibration and/or optionally increases the current provided to the activated components. For instance, in response to the temperature dropping, the engine 509 may additionally activate the detectors 536 (FIG. 5) and activate the receiver controller 510 to raise the temperature of the components undergoing calibration back to the first temperature.

At operation 825, the optical thermal feedback engine 509 initializes the second device under temperature. For example, one or more photonics components of the optical-electrical device that are not undergoing calibration are activated to increase an amount of heat and raise the temperature of the device to the second temperature.

After the optical-electrical device is set to the second temperature at operation 825, one or more components of the device under test are calibrated at the second temperature. For example, each of the same components calibrated at operation 810 at the first temperature are again calibrated at operation 830, but at the second temperature, where operation 830 loops to calibrate each additional optical component.

While calibration of the one or more components is performed at operation 830, the optical thermal feedback engine 509 simultaneously implements operations 835 and 840 to perform closed-loop (feedback-based) control of the optical-electrical DUT at the second temperature. For example, at operation 835, if the temperature sensor (e.g., PIC temperature sensor 408, FIG. 4) generates temperature data or a signal (e.g., analog signal) that indicates the device is increasing in temperature, then at operation 840, the engine 509 adjusts the current supplied to the activated components (e.g., if the SOAs 535 are already activated and set to maximum gain, then reduce the gain), and/or reduces the quantity of activated components not undergoing calibration by disabling them (e.g., turning the SOAs 535) to reduce heat flow and return the device temperature back to the second calibration temperature. Conversely, if the temperature decreases lower than the second temperature, additional non-calibrated components of the device are activated to increase the DUT temperature back to the second temperature.

At operation 845, the engine 509 stores calibration data to the device to complete the calibration process. For example, at operation 845, the engine 509 stores the gain and bias values that can be used to operate the device at a later point in time (e.g., after manufacturing time, in the field, when integrated into another product).

Figure 9:
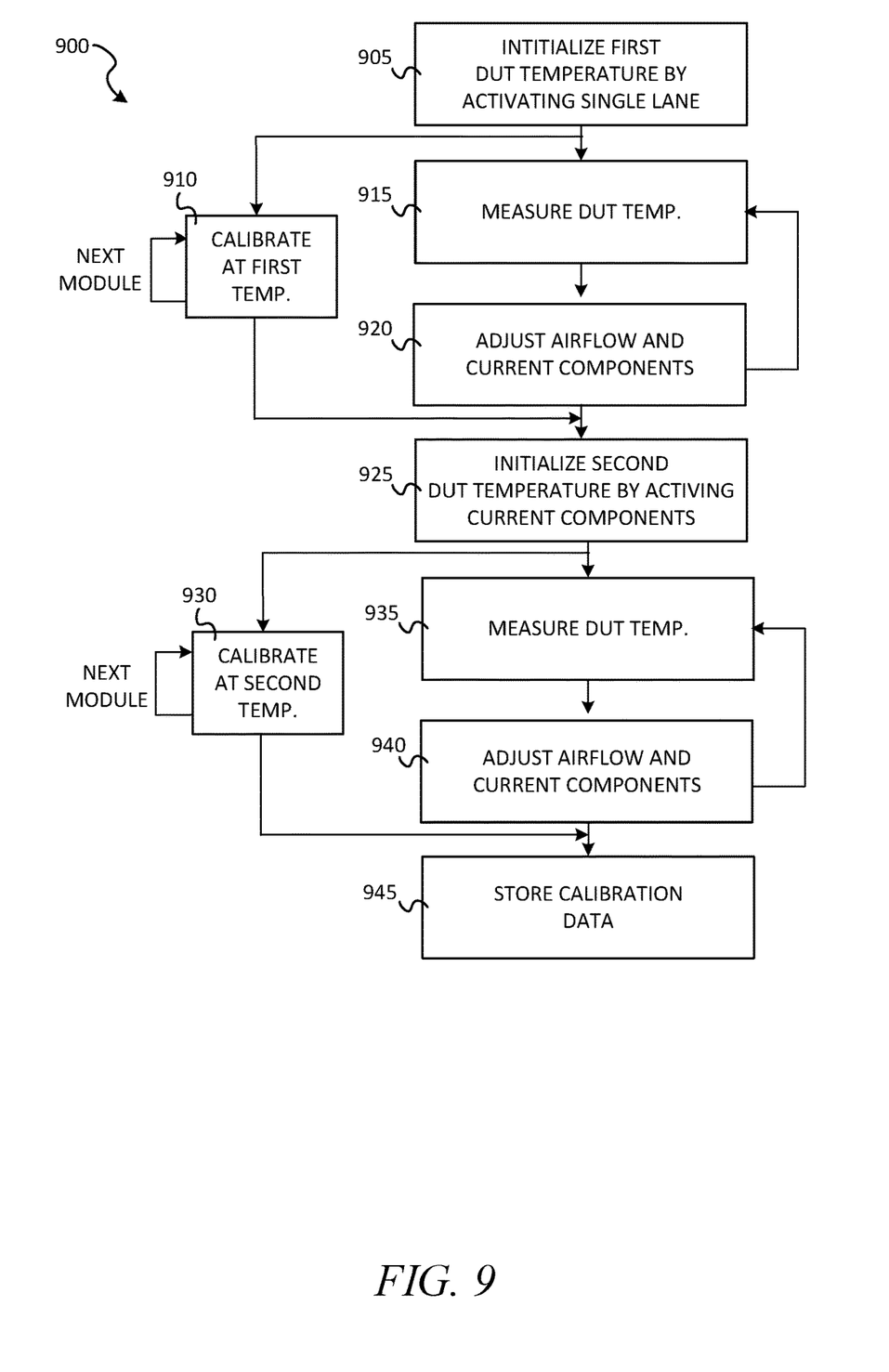
FIG. 9 shows a flow diagram of a method for implementing optical-electrical device calibration at one or more calibration temperatures using an optical-electrical ATE system and closed loop control using passive byproduct heat and airflow, according to some example embodiments.

FIG. 9 shows a flow diagram of a method 900 for implementing optical-electrical device calibration at one or more calibration temperatures using an optical-electrical ATE system and closed-loop control using passive byproduct heat and airflow, according to some example embodiments. In the example of FIG. 9, the non-calibrated DUT optical components provide closed-loop heat and cooling control, and the compressed airflow also provides closed-loop heating and cooling control in concert. Further, although in the example of FIG. 9 the components are calibrated at two temperatures, it is appreciated that in some example embodiments, one or more of the components is calibrated at a single temperature and one or more operations of method 900 are omitted (e.g., operations 925-940).

At operation 905, the optical thermal feedback engine 509 initializes the first device under test temperature (e.g., 30 degrees Celsius). For example, the first temperature can be set by powering on the components to be calibrated (e.g., activating components in lane 516), and optionally powering on components that are not undergoing calibration (e.g., nearby components in the other lanes of the transmitter, or components in the receiver such as SOAs 534).

After the optical-electrical device under test is set to the first temperature at operation 905, one or more components of the device under test are then calibrated at operation 910. For example, at operation 910, the laser 550 in the first transmitter lane 516 is calibrated while at the first temperature set at operation 905. In some example embodiments, one or more additional components of the optical electrical device under test are also then calibrated at the same temperature by looping back to operation 910. For instance, the engine 509 may first calibrate the laser 550 at the first temperature, then calibrate the EAM 552 at the first temperature, followed by calibrating the MZI 555 at the first temperature until all parts to be calibrated at the first temperature are calibrated, thereby ending the calibration loop at operation 910.

While calibration of the one or more components is performed at operation 910, the optical thermal feedback engine 509 simultaneously implements operations 915 and 920 to perform closed-loop (feedback-based) control of the optical-electrical DUT at the first temperature using both airflow control, activating components not being calibrated, and varying the current provided to those components (e.g., increasing/decreasing SOA gain), as discussed above. For example, in response to the optical-electrical device increasing higher than the first temperature, the engine 509 generates a control signal to actuate the airflow valve to open, thereby increasing the airflow over the device to wick away heat and decrease the temperature back to the first temperature. In some example embodiments, to more rapidly increase or decrease the temperature back to the first calibration temperature, the quantity of non-calibrated components and the power supplied to them is also modified to return the device under test to the first temperature.

At operation 925, the optical thermal feedback engine 509 initializes the second device under temperature. For example, if the first temperature of operation 905 was set at least in part by activating the current-driven components in the fourth lane 518, then at operation 925 the engine 905 activates additional current-driven components to add heat such that the optical-electrical device settles at the second temperature.

After the optical-electrical device is set to the second temperature at operation 925, one or more components of the device under test are calibrated at the second temperature. For example, each of the same components calibrated at operation 910 at the first temperature are again calibrated at operation 930 but at the second temperature, where operation 930 loops to calibrate each additional optical component.

While calibration of the one or more components is performed at operation 930, the optical thermal feedback engine 509 simultaneously implements operations 935 and 940 to perform closed-loop (feedback-based) control of the optical-electrical DUT at the second temperature using airflow and the current-driven component activation, adjustment, or deactivation as performed at operation 920.

At operation 945, the engine 509 stores calibration data to the device to complete the calibration process. For example, at operation 945, the engine 509 stores the gain and bias values that can be used to operate the device at a later point in time (e.g., after manufacturing time, in the field, integrated into another product).

The following are example embodiments:

Example 1. A method for calibrating optical components in a photonics integrated circuit (PIC), the method comprising: activating one or more active optical components in the photonics integrated circuit (PIC) of an optical-electrical circuit structure, the optical-electrical circuit structure comprising the PIC and one or more electrical circuits external to the PIC, the one or more electrical circuits including a processor circuit configured to generate a temperature control signal that adjusts an electrically controlled pressured air source that is configured to direct a high pressure airflow towards the PIC; generating an initial temperature value using an integrated temperature sensor that is integrated in the optical-electrical circuit structure, the integrated temperature sensor being positioned proximate to the active optical components such that the integrated temperature sensor receives heat generated by the active optical components in the PIC, the initial temperature value indicating that the PIC is at an initial temperature after activation of the one or more active optical components in the PIC, the initial temperature corresponding to a preconfigured calibration temperature utilized to calibrate the PIC; receiving calibration adjustments to the one or more active optical components of the PIC while the initial temperature value generated by the integrated temperature sensor indicates the PIC is at the initial temperature; detecting, by the processor circuit, varying temperature values generated by the integrated temperature sensor; and in response to the varying temperature values, continually adjusting, using the processor circuit, the temperature control signal to cause the electrically controlled pressured air source to vary a strength of the high pressure airflow directed towards the PIC such that a temperature of the PIC is adjusted closer to the initial temperature due to the high pressure airflow passing over the PIC while the one or more active optical components are calibrated.

Example 2. The method of example 1, wherein the high pressure airflow is directed to the PIC using a hollow tube that is near the PIC.

Example 3. The method of example 1 or 2, wherein the hollow tube does not touch the PIC while directing the high pressure airflow towards the PIC.

Example 4. The method of any of examples 1-3, wherein the electrically controlled pressured air source is an air compressor with an electrically controllable valve.

Example 5. The method of any of examples 1-4, wherein the processor circuit is electrically connected to the PIC to receive temperature vales from the integrated temperature sensor.

Example 6. The method of any of examples 1-5, wherein the one or more electrical circuits external to the PIC are connected to the PIC using one or more electrical contacts.

Example 7. The method of any of examples 1-6, wherein the one or more electrical contacts comprise metal contacts on the PIC.

Example 8. The method of any of examples 1-7, wherein the PIC comprises additional active optical components that operate independently of the one or more active optical components.

Example 9. The method of any of examples 1-8, wherein the PIC is an optical transceiver comprising an optical transmitter and an optical receiver, wherein the one or more active optical components are optical transmitter components of the optical transmitter, and wherein the additional active optical components are optical receiver components of the optical receiver.

Example 10. The method of any of examples 1-9, wherein the PIC is a multi-lane optical transmitter, wherein the one or more active optical components are components of one lane of the multi-lane optical transmitter, and wherein the additional active optical components are other optical components in other lanes of the multi-lane optical transmitter.

Example 11. The method of any of examples 1-10, wherein the PIC is a multi-lane optical receiver, wherein the one or more active optical components are components of one lane of the multi-lane optical receiver, and wherein the additional active optical components are other optical components in other lanes of the multi-lane optical receiver.

Example 12. The method of any of examples 1-11, wherein the one or more active optical components are components for calibration at the initial temperature corresponding to a preconfigured calibration temperature, wherein the additional active optical components are current-receiving components of the PIC not receiving calibration adjustments at the initial temperature that corresponds to the preconfigured calibration temperature.

Example 13. The method of any of examples 1-12, further comprising: activating the additional active optical components to increase heat in the PIC; generating an elevated temperature value using the integrated temperature sensor, the elevated temperature value corresponding to an elevated preconfigured calibration temperature that is higher than the preconfigured calibration temperature; receiving calibration adjustments while the PIC is at the elevated preconfigured calibration temperature; detecting, by the processor circuit, additional varying temperature values generated by the integrated temperature sensor; and in response to the additional varying temperature values, continually adjusting the temperature control signal to cause the electrically controlled pressured air source to vary the strength of the high pressure airflow directed toward the PIC such that the temperature of the PIC is adjusted close to the elevated preconfigured calibration temperature.

Example 14. The method of any of examples 1-13, wherein the one or more active optical components are activated at least in part by supplying electrical current to the one or more active optical components.

Example 15. The method of any of examples 1-14, wherein the one or more active optical components include one or more of: a light source, an optical amplifier, an electro-absorption modulator (EAM), a phase-based coupler, a photodetector.

Example 16. A system comprising: one or more processors of a machine; and a memory storing instructions that, when executed by the one or more processors, cause the machine to perform operations implementing any one of example methods 1-15.

Example 17. A machine-readable storage device embodying instructions that, when executed by a machine, cause the machine to perform operations implementing one of methods 1-15.

In the foregoing detailed description, the method and apparatus of the present inventive subject matter have been described with reference to specific exemplary embodiments thereof. It will, however, be evident that various modifications and changes may be made thereto without departing from the broader spirit and scope of the present inventive subject matter. The present specification and figures are accordingly to be regarded as illustrative rather than restrictive.

What is claimed is:

1. A method for calibrating optical components in a photonic integrated circuit (PIC), the method comprising:

activating one or more active optical components in the PIC of an optical-electrical circuit structure, the optical-electrical circuit structure comprising the PIC and one or more electrical circuits external to the PIC, the one or more electrical circuits including a processor circuit configured to generate a temperature control signal that adjusts an electrically controlled pressured air source that is configured to direct a high pressure airflow towards the PIC;

generating an initial temperature value using an integrated temperature sensor that is integrated in the optical-electrical circuit structure, the integrated temperature sensor being positioned proximate to the active optical components such that the integrated temperature sensor receives heat generated by the active optical components in the PIC, the initial temperature value indicating that the PIC is at an initial temperature after activation of the one or more active optical components in the PIC, the initial temperature corresponding to a preconfigured calibration temperature utilized to calibrate the PIC;

receiving calibration adjustments to the one or more active optical components of the PIC while the initial temperature value generated by the integrated temperature sensor indicates the PIC is at the initial temperature;

detecting, by the processor circuit, varying temperature values generated by the integrated temperature sensor; and in response to the varying temperature values, adjusting, using the processor circuit, the temperature control signal to cause the electrically controlled pressured air source to vary a strength of the high pressure airflow directed towards the PIC such that a temperature of the PIC is adjusted closer to the initial temperature due to the high pressure airflow passing over the PIC while the one or more active optical components are calibrated.

2. The method of claim 1, wherein the temperature control signal is continually adjusted to cause the electrically controlled pressured air source to vary a strength of the high pressure airflow, and wherein the high pressure airflow is directed to the PIC using a directional channel that is near the PIC.

3. The method of claim 2, wherein the directional channel does not touch the PIC while directing the high pressure airflow towards the PIC.

4. The method of claim 1, wherein the electrically controlled pressured air source is an air compressor with an electrically controllable valve.

5. The method of claim 1, wherein the processor circuit is electrically connected to the PIC to receive temperature vales from the integrated temperature sensor.

6. The method of claim 1, wherein the one or more electrical circuits external to the PIC are connected to the PIC using one or more electrical contacts.

7. The method of claim 6, wherein the one or more electrical contacts comprise metal contacts on the PIC.

8. The method of claim 1, wherein the PIC comprises additional active optical components that operate independently of the one or more active optical components.

9. The method of claim 8, wherein the PIC is an optical transceiver comprising an optical transmitter and an optical receiver, wherein the one or more active optical components are optical transmitter components of the optical transmitter, and wherein the additional active optical components are optical receiver components of the optical receiver.

10. The method of claim 8, wherein the PIC is a multi-lane optical transmitter, wherein the one or more active optical components are components of one lane of the multi-lane optical transmitter, and wherein the additional active optical components are other optical components in other lanes of the multi-lane optical transmitter.

11. The method of claim 8, wherein the PIC is a multi-lane optical receiver, wherein the one or more active optical components are components of one lane of the multi-lane optical receiver, and wherein the additional active optical components are other optical components in other lanes of the multi-lane optical receiver.

12. The method of claim 8, wherein the one or more active optical components are components for calibration at the initial temperature corresponding to a preconfigured calibration temperature, wherein the additional active optical components are current-receiving components of the PIC not receiving calibration adjustments at the initial temperature that corresponds to the preconfigured calibration temperature.

13. The method of claim 8, further comprising:
activating the additional active optical components to increase heat in the PIC;
generating an elevated temperature value using the integrated temperature sensor, the elevated temperature value corresponding to an elevated preconfigured calibration temperature that is higher than the preconfigured calibration temperature;
receiving calibration adjustments while the PIC is at the elevated preconfigured calibration temperature;
detecting, by the processor circuit, additional varying temperature values generated by the integrated temperature sensor; and
in response to the additional varying temperature values, continually adjusting the temperature control signal to cause the electrically controlled pressured air source to vary the strength of the high pressure airflow directed toward the PIC such that the temperature of the PIC is adjusted close to the elevated preconfigured calibration temperature.

14. The method of claim 1, wherein the one or more active optical components are activated at least in part by supplying electrical current to the one or more active optical components.

15. The method of claim 14, wherein the one or more active optical components include one or more of: a light source, an optical amplifier, an electro-absorption modulator (EAM), a phase-based coupler, a photodetector.

16. An optical-electrical structure comprising:
a photonic integrated circuit (PIC) comprising one or more active optical components that receive current to set the PIC at an initial temperature, the one or more active optical components receiving calibration adjustments while the PIC is set to the initial temperature;
an integrated temperature sensor that is positioned proximate to the active optical components such that the integrated temperature sensor receives heat generated by the active optical components in the PIC, the integrated temperature sensor to generate an initial temperature value in response to the one or more active optical components receiving current; and
one or more electrical circuits external to the PIC, the one or more electrical circuits including a processor circuit configured to generate a temperature control signal that adjusts an electrically controlled pressured air source that is configured to direct a high pressure airflow towards the PIC, the processor circuit configured to, in response detecting varying temperature values generated by the integrated temperature sensor, adjust the temperature control signal to cause the electrically controlled pressured air source to vary a strength of the high pressure airflow directed towards the PIC such that a temperature of the PIC is adjusted closer to the initial temperature due to the high pressure airflow on the PIC while the one or more active optical components receive calibration adjustments.

17. The optical-electrical structure of claim 16, wherein the temperature control signal is continually adjusted to cause the electrically controlled pressured air source to vary a strength of the high pressure airflow, and wherein the high pressure airflow is directed to the PIC using a hollow tube that is near the PIC.

18. The optical-electrical structure of claim 16, wherein the integrated temperature sensor is integrated in the PIC.

19. The optical-electrical structure of claim 16, wherein the processor circuit is electrically connected to the PIC to receive temperature vales from the integrated temperature sensor.

20. The optical-electrical structure of claim 16, wherein the PIC comprises additional active optical components that operate independently of the one or more active optical components, the additional active components configured to receive additional current to increate heat in the PIC for additional calibration adjustments at an elevated temperature.

* * * * *